United States Patent [19]

Paterson et al.

[11] 4,417,824
[45] Nov. 29, 1983

[54] OPTICAL KEYBOARD WITH COMMON LIGHT TRANSMISSION MEMBERS

[75] Inventors: Robert L. Paterson, Nicholasville; Jerry M. Sublette, Lexington, both of Ky.

[73] Assignee: International Business Machines Corporation, Armonk, N.Y.

[21] Appl. No.: 375,799

[22] PCT Filed: Mar. 29, 1982

[86] PCT No.: PCT/US82/00379
§ 371 Date: Mar. 29, 1982
§ 102(e) Date: Mar. 29, 1982

[51] Int. Cl.³ ............................................. B41J 5/00
[52] U.S. Cl. ................................ 400/477; 340/365 P; 178/17 C; 235/145 R; 250/221; 250/578; 350/96.1
[58] Field of Search ............ 400/477, 479, 472; 178/17 C, 17 D; 235/145 R; 250/221, 578; 340/365 P; 350/96.1, 96.15, 96.16, 301

[56] References Cited

U.S. PATENT DOCUMENTS

| | | | |
|---|---|---|---|
| 3,603,982 | 9/1971 | Patti | 178/17 C |
| 3,609,759 | 9/1971 | Teske | 340/365 |
| 3,758,197 | 9/1973 | Klang et al. | 350/96.1 X |
| 3,796,880 | 3/1974 | Dorey | 250/209 |
| 3,856,127 | 12/1974 | Halfon et al. | 400/479 |
| 4,142,877 | 3/1979 | Auracher et al. | 350/96.15 X |
| 4,311,990 | 1/1982 | Burke | 250/221 |

FOREIGN PATENT DOCUMENTS 1463246  11/1966  France ................................. 350/301

OTHER PUBLICATIONS

IBM Technical Disclosure Bulletin, vol. 23, No. 11, Apr. 1981, pp. 4998–4999, "Optical Keyboard", W. S. Duncan, et al.

Primary Examiner—Edgar S. Burr
Assistant Examiner—David A. Wiecking
Attorney, Agent, or Firm—John W. Girvin, Jr.

[57] ABSTRACT

A keyboard assembly (FIG. 1, 11) is constructed of first light transmission members (13) second light transmission members (15), a key actuation assembly (17) having a matrix of keybuttons (25), plural light source assembly (19) and plural sensor assembly (21). Each light source on assembly (19) is exclusively and sequentially energized causing its light to be transmitted through the first light transmission member (13) to be split up and deflected downwardly by the surfaces (43) and then rightwardly by the surfaces (45) to emanate through the surfaces (47) to enter the surfaces (49) of the second light transmission member. Actuation of a keybutton (25) causes its associated interrupter (29) to assume a light blocking position between the first light transmission member (13) and a second light transmission member (15). Light passing through the second light transmission member (15) to the sensor array indicates that none of the interrupters (29) have blocked the light path. This geometrical arrangement provides N key rollover detection with phantom key lockout and the light transmission members (13, 15) may be made of a single part or a single part for each row or column. Such parts provide common light transmission paths.

5 Claims, 9 Drawing Figures

OPTICAL KEYBOARD WITH COMMON LIGHT TRANSMISSION MEMBERS

BACKGROUND OF THE INVENTION

1. Technical Field

This invention relates to a photo-optical keyboard and more particularly, to a photo-optical keyboard having molded common light transmission members which may be readily assembled into a keyboard.

2. Background Art

Prior art photo-optical keyboards generally comprise a matrix of keys arranged so that downward depression of any single key interrupts the passage of light being transmitted between a light source and a photosensor. Since the keys are arranged in a row-column matrix, there is generally a light source and a corresponding sensor for each row and for each column. A check of both the row and column sensors is made to indicate the identity of the depressed key. Although such keyboards correctly indicate the properly depressed key, they fail to provide an N key roll-over function. That is, if two or more keys in the same rows and/or columns are simultaneously depressed, the system cannot distinguish the third such depressed key. These types of keyboards often may be readily assembled from molded parts having common light transmission members providing a manufacturing advantage.

U.S. Pat. No. 3,856,127 teaches a matrix keyboard arrangement in its FIG. 7-8 embodiment having a light source associated with each row of keys and a photosensor associated with each column of keys. Individual bundles of optical fibers are arranged to emanate from each light source, and traverse along a row with individual fibers in each bundle terminating at different column positions adjacent a switch interrupter.

Second bundles of optical fibers emanate from each sensor and traverse along each column with individual fibers of each bundle terminating at different row positions adjacent a switch interrupter. The row light sources are sequentially energized so that actuation of any switch interrupter having an optical fiber adjacent thereto leading from the energized light source causes an interruption of light transmitted through the adjacent column optical fiber to the column sensor associated with that switch. Thus, multiple switches in the same row can be energized thereby providing multiple indications of key depressions to the corresponding multiple column sensors. Further, multiple simultaneous key depression in the same column provides a timed sequential output signal to the same column sensor thereby indicating all of the keys depressed. This keyboard thus has N key roll-over capability. However, the keyboard is very complex in its assembly since each column optical fiber must be precisely aligned with each corresponding row optical fiber so that key actuation provides a light interrupt. Further, each fiber must be properly placed relative to the light sources and sensors and hand routed through the keyboard assembly. Additionally, the fibers must be properly tied to the machine frame in order to prevent machine vibrations from displacing the critically placed fibers. The keyboard is thus difficult to assemble and to maintain in proper working order.

DISCLOSURE OF INVENTION

In order to overcome the aforenoted shortcomings of the prior art and to provide a molded photo-optical keyboard having N key roll-over capabilities, the keyboard of the present invention is provided with two uniquely shaped light transmission members which may be readily snapped together to form a keyboard detection assembly. The light transmission members have formed therein reflecting surfaces to bend the light along the light transmission path so that light is transmitted along common column paths from the source to the various row paths and thence along common row light paths to the sensors. A further molded assembly carrying the key actuators is located with respect to the detection assembly thereby eliminating the need to individually route and align each light path. This latter assembly may also be molded with one of the light transmission members.

The foregoing and other features and advantages of this invention will be apparent from the following more particular description of the preferred embodiment of the invention as illustrated in the accompanying drawing.

BEST MODES FOR CARRYING OUT THE INVENTION

Figure 1:
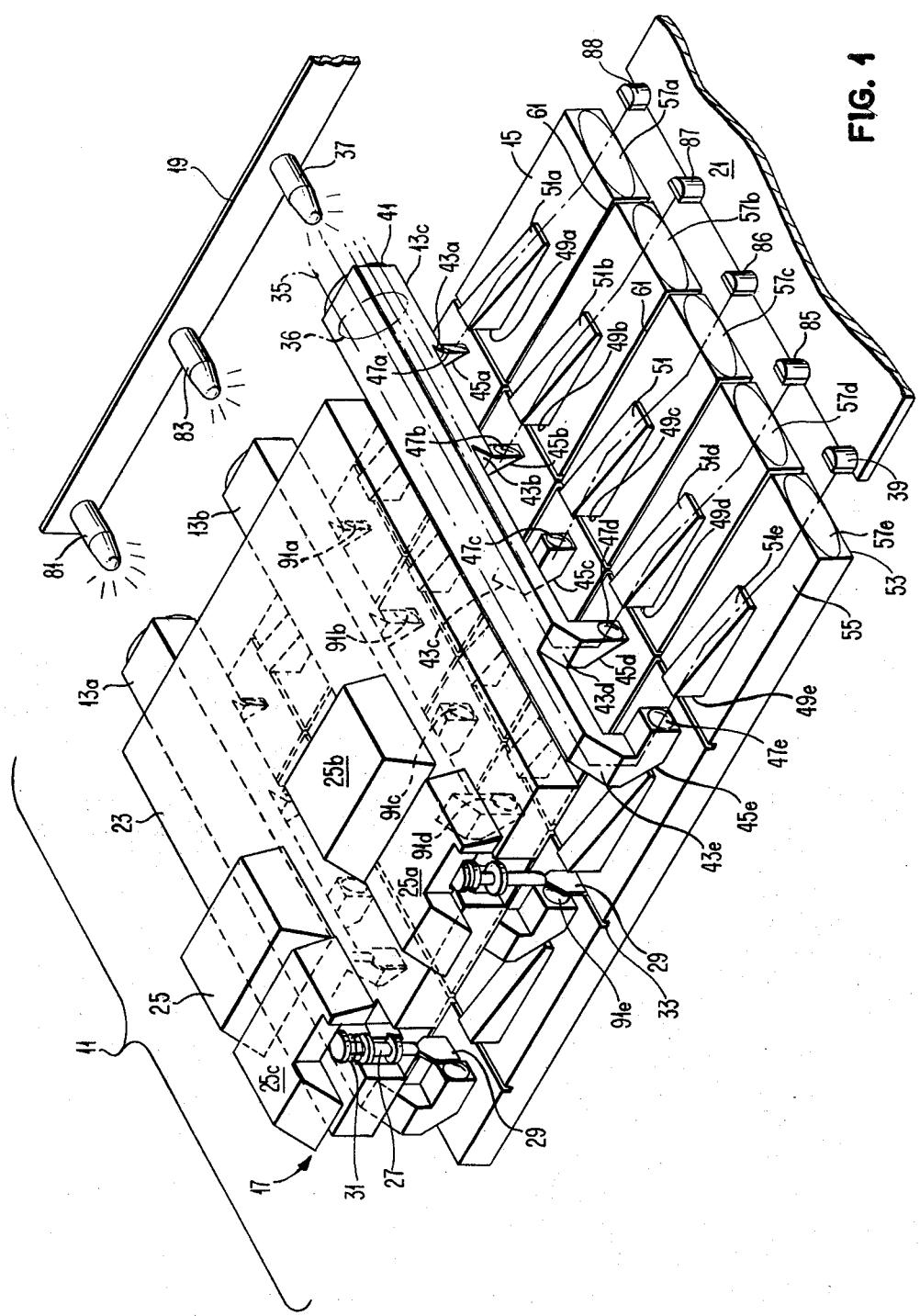
FIG. 1 is a broken perspective view of a partially assembled keyboard assembly constructed in accordance with the present invention.

Referring now to the drawing and more particularly, to FIG. 1 thereof, a broken perspective view of a partially assembled keyboard assembly 11 constructed in accordance with the present invention is depicted. The keyboard assembly 11 includes first light transmission members 13a, 13b, 13c, a second light transmission member 15, a key actuation assembly 17, plural light source assembly 19, and plural sensor assembly 21.

The key actuation assembly 17 includes a support plate 23, keybuttons 25, key stems 27, interrupters 29 and springs 31. Depression of a keybutton 25 effects the compression of spring 31 as the key stem is moved downward through the support plate 23 causing the interrupter 29 to move into a light path interruption position. A groove 33 formed in the second light transmission member 15 allows the interrupter 29 to descend so as to block all light without mechanically bottoming out.

A light ray 35 of the light beam 36 emanating from an energized light source 37 located on the plural light source assembly 19 and terminating at the sensor 39 located on the plural sensor assembly 21 has been illustrated to depict the path that such a light ray 35 travels when not interrupted by an interrupter 29. The light source 37 may be a conventional light emitting diode which has a given distribution of light flux associated with it. The end surface 41 of the first light transmission members 13c is formed in a rounded lens fashion to redirect the energy from the light source 37 along the first light transmission member 13c, slightly converging the light. As the light beam 36 traverses down the first light transmission member 13c, it encounters surfaces 43a–43e which bend or reflect portions of the light beam 36 in a downward direction. There is a surface 43 formed within each first light transmission member 13a–13c for each row of keys. The area of each surface 43 of the first light transmission member 13c differs from that of the other surfaces 43. Each surface 43 area is designed so that the light energy bent downward for each division of the light beam 36 within the first light transmitting member 13c is equal. Since the surface 43a is closer to the light source 37 than the surface 43e, the surface area of surface 43a is smaller than that of surface 43e. The surface areas of the surfaces 43a–43e are thus inversely proportional to their distance from their associated light source 37.

Second surfaces 45a–45e of the first light transmission member 13c are used to redirect the light toward the right as viewed in a direction approximately orthogonal or perpendicular to the initial direction of travel of the light beam 36. As thusly directed, the divided light beams 36 are aimed in the general direction of the plural sensor assembly 21.

The first light transmission members 13a–13c are formed of a clear plastic material such as acrylic plastic. Most of the light flux entering the first light transmission member remains therein due to the phenomena of total internal reflection. The surfaces 43 and 45 are designed to contain a surface area large enough to reflect by total internal reflection, all of the light energy so as to change its direction of travel. Once the light beams 36 are reflected from the surfaces 45, they emanate through the surfaces 47a–47e of the first light transmission member 13c and, if not blocked by an interrupter 29, enter the second light transmission member 15 at a paired surface 49a–49e. Each of the surfaces 47a–47e and 49a–49e are designed as a pair to minimize cross-talk and maximize light throughput. The second light transmission member 15 is also formed of a clear plastic material such as acrylic plastic.

Light entering the second light transmission member through the surfaces 49a–49e is reflected by total internal reflection or by design of surfaces 47 and 49 using refraction, from the surfaces 51a–51e to the surfaces 53 and 55. The surfaces 53 and 55 are used to confine the light to a particular part of the second light transmission member 15. Light ray 35 shows that the light emanates from the surface 57e onto the active element of the sensor 39. The surface 57e is designed to focus the light onto the sensor 39.

As depicted, there are plural first light transmission members 13a, 13b, 13c, there being a light transmission member for each column of the keyboard assembly 11. As also depicted, the second light transmission member 15 is divided by channels 61 to thus designate different rows along which light is transmitted. It should be noted that the first light transmission members 13 may be molded as a single part along with the support plate 23 and that the second light transmission member may be molded as a single piece without channel 61 or as plural pieces divided where illustrated by channel 61.

Figure 2:
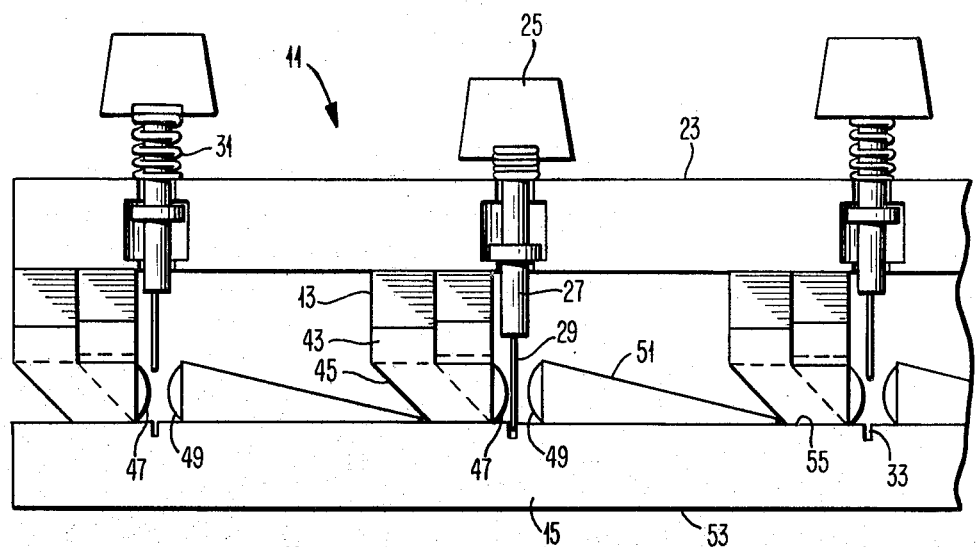
FIG. 2 is a side sectional view of a portion of the keyboard assembly.

Referring now to FIG. 2 of the drawing, a side sectional view of a portion of the keyboard assembly 11 is depicted. As depicted, the keybutton 25 has been depressed causing the interrupter 29 to block the light path between the surface 47 of the first light transmission member 13 and surface 49 of the second light transmission member 15.

Figure 3:
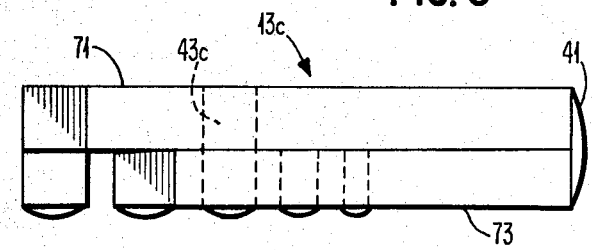
FIG. 3 is a top view of a first light transmission member.
Figure 5:
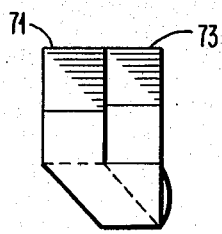
FIG. 5 is an end view of a first light transmission member.
Figure 4:
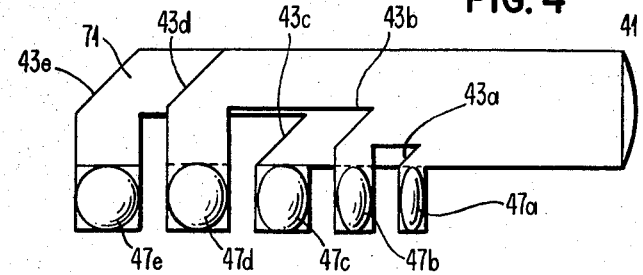
FIG. 4 is a side view of a first light transmission member.

With reference to FIGS. 3, 4 and 5, top, side and end views respectively of a first light transmission member 13c are depicted. In this particular illustration, the first light transmission member 13c is formed of two parts, 71 and 73 and an additional lens end surface 41. Part 73 is shaped to contain surfaces 43a, 43b, and 43d while part 71 has surfaces 43e and 43c. These views depict the varying size of the surfaces 43 and the surfaces 47.

Figure 6:
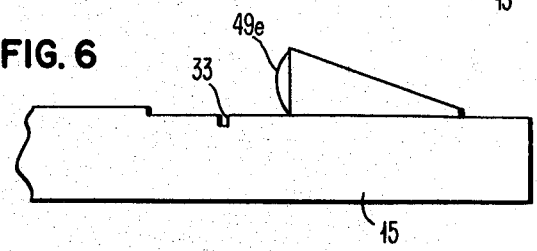
FIG. 6 is a side view of a portion of a second light transmission member.
Figure 7:
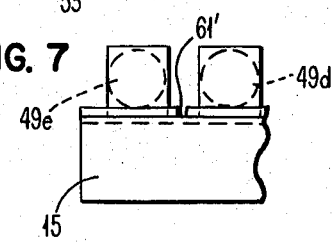
FIG. 7 is an end view of a portion of a second light transmission member.

FIGS. 6 and 7 depict a side and end view of a portion of the second light transmitting member 15. As depicted, the second light transmitting member 15 is a single piece and has channel 61' therein and the surfaces 49d and 49e are shown of equal size. The surfaces 49d and 49e may be shaped to correspond to those of surfaces 47 of FIG. 4. Further, the channel 61' may be eliminated.

Referring once again to FIG. 1 of the drawing, operation of the keyboard assembly 11 will now be described. Light sources 81, 83 and 37 are energized sequentially, one at a time. When, for example, light source 37 is energized, only the first light transmission member 13c receives light from a light source on the plural light source assembly 19. This light is reflected as has been previously described so that it emanates simultaneously through all of the surfaces 47a–47e to be transmitted through the second light transmission member 15 to be received simultaneously by the sensors 39, 85–88 located on the plural sensor assembly 21. Such a simultaneous receipt of light by the sensors located on the plural sensor assembly 21 indicates that no keys associated with light transmitted through the light transmission member 13c have been depressed.

When the light source 83 is sequenced on, the light beam transmitted through the first light transmission member 13b emanates in a similar fashion from the surfaces 91a–91e. However, light emanating from the surface 91e is blocked by the interrupter 29 from entering into the second light transmission member 15. Thus, the sensor 39 does not detect presence of light from the light source 83. Since the logic understands that the light source 83 has been energized and that the sensor 39 has failed to detect light during the period of energization of the light source 83, it is readily apparent that the logic may detect that the keybutton 25a has been depressed.

N key rollover has been provided since the logic can detect simultaneous key depression. For example, if keybutton 25b were depressed simultaneously with keybutton 25a, light emanating from the light source 83 would not reach sensor 85. Since both sensors 39 and 85 would fail to detect light from the source 83 during the time of its energization, the logic can indicate that both keys are depressed. Simultaneous depression of all keybuttons 25 in a row associated with a single first light transmission member 13a–13c could thus be detected by the logic circuit.

In a similar vein, if the keybutton 25c is simultaneously depressed with the keybutton 25a, no light from the source 81 would be detected by the sensor 39 when the source 81 is energized. Thereafter, no light would be detected by the sensor 39 when the source 83 is energized. Thus, the logic would provide an indication that both the keys 25c and 25a were simultaneously depressed. If the keys 25a, 25b, and 25c were simultaneously depressed, only the sensor 39 would fail to detect the light from the source 81 during its energization and thereafter, both the sensor 39 and the sensor 85 would fail to detect light during the time period of the energization of the source 83. The system logic could thusly determine that all three keybuttons were depressed.

Figure 8:
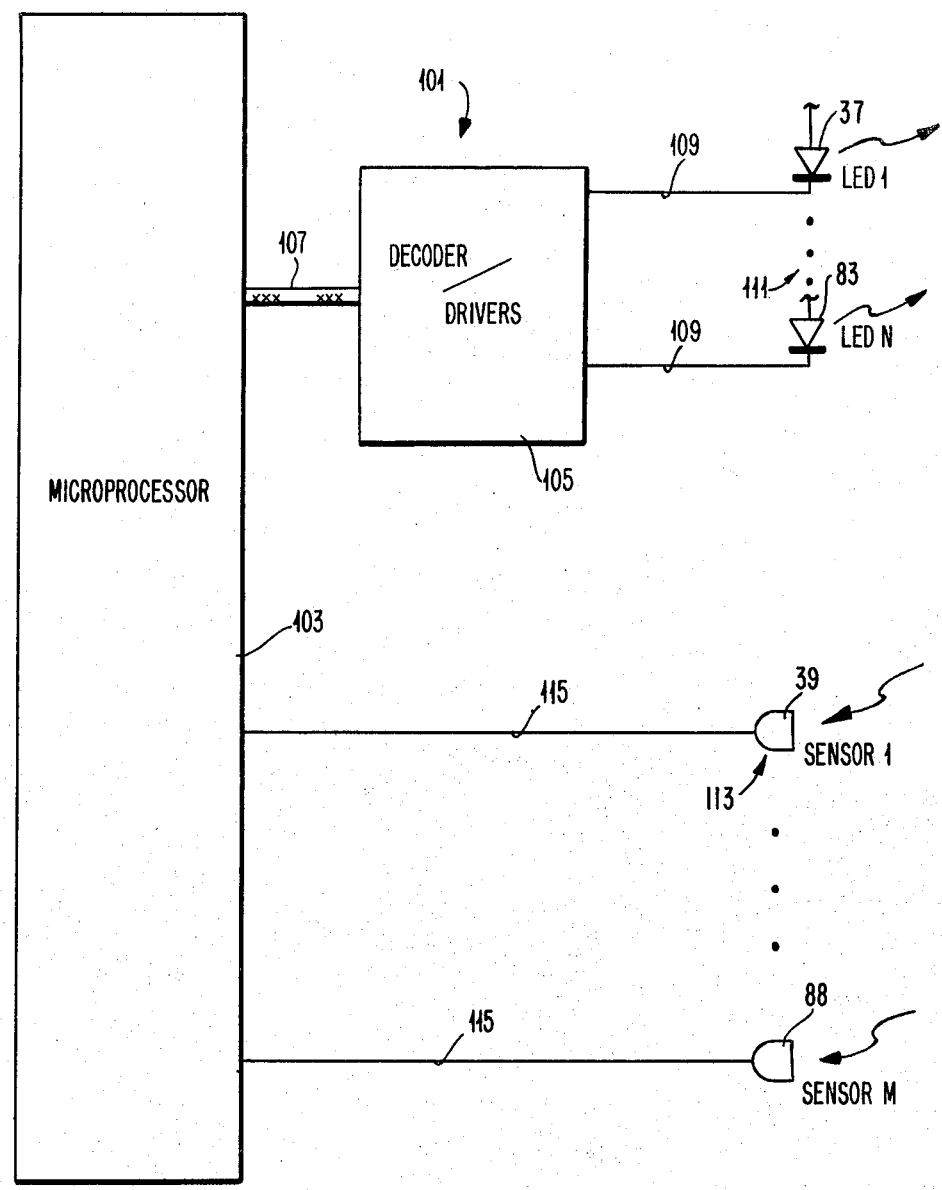
FIG. 8 is a schematic diagram of the logic detection circuitry of the keyboard of the present invention.

Referring now to FIG. 8 of the drawing, a schematic diagram of the logic detection circuitry 101 of the keyboard of the present invention is depicted. The logic detection circuitry 101 includes a microprocessor 103 and decoder/driver circuitry 105. The microprocessor is programmed to provide clocked output signals on bus 107 to the decoder/driver circuitry 105 which in turn provides output signals on lines 109 to a corresponding plurality of light emitting diodes 111 which correspond to the light sources 37, 81, 83 located on the light source assembly 19 of FIG. 1. The signals provided on the lines 109 are mutually exclusive and are timewise sequenced. Additionally, the microprocessor 103 is responsive to the sensors 113 which are connected to its input ports by lines 115. The sensors 113 correspond to the sensors 39, 85-88 of FIG. 1.

Figure 9:
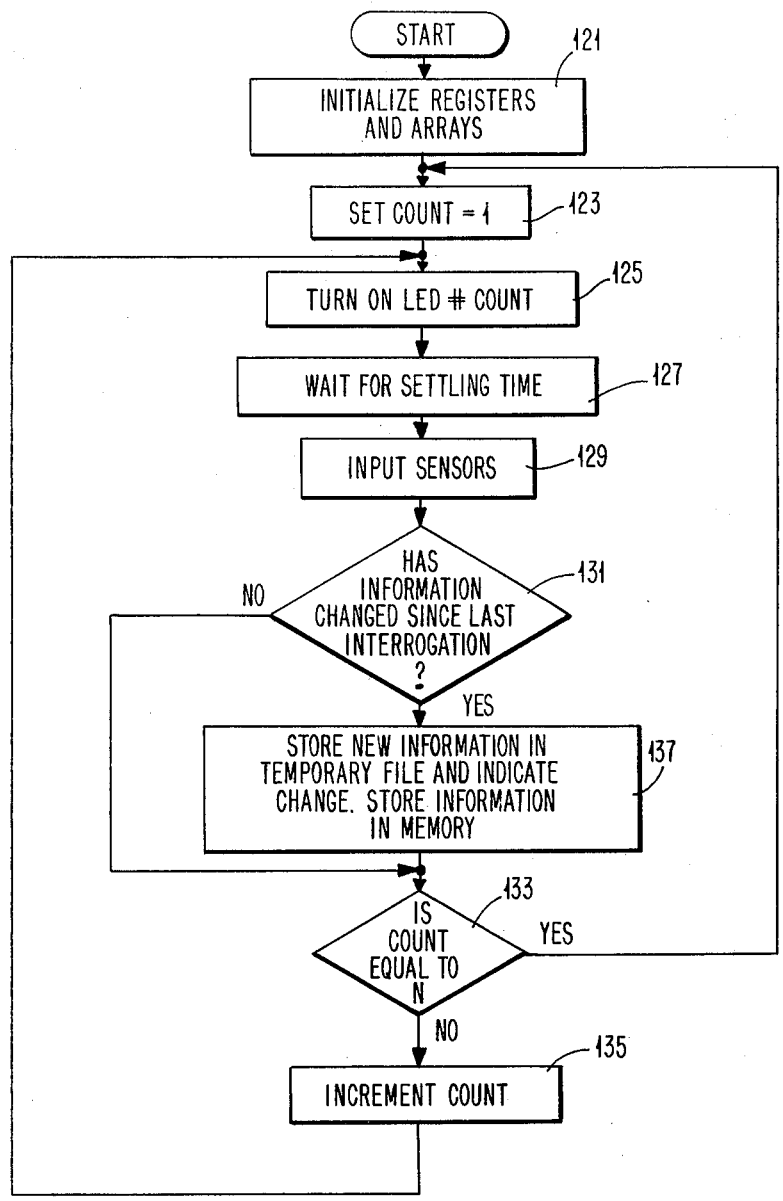
FIG. 9 is a sequential diagram of the logic of the keyboard assembly of the present invention.

Referring now to FIG. 9, a sequential diagram of the logic of the keyboard assembly of the present invention is depicted. The microprocessor 103 of FIG. 8 causes its registers and arrays to be initialized upon a power-on condition as indicated by block 121. Thereafter, the count in a register is set equal to one as indicated by block 123 and a first light emitting diode such as source 81 of FIG. 1 is turned on as indicated by block 125. After a delay as indicated by block 127, the output of the sensors 39, 85-88 are sampled as indicated by block 129 and a test is performed to determine whether the sensor provided indication has changed as indicated by block 131. If there is no change indicating no keybutton 25 (FIG. 1) movement, a check is made to determine whether all of the light sources 81-83-37 have been sequenced as indicated by block 133 and if not, the count is incremented as indicated by block 135 and the next light emitting diode to be energized is turned on as indicated by block 125. If all of the light sources have been energized, the count is set equal to light source 1 as indicated by block 123 and the procedure is again reiterated.

Whenever a key state has changed from the previous interrogation state, block 131 indicates an information change and that information is stored in a temporary file and a flag is set to indicate that a change has been detected. The changed information indicating specific key depression is then stored for further processing by the microprocessor 103 of FIG. 8 which indicates to a utilization device the specific keybutton 25 actuated or not actuated. This is generally indicated by block 137.

While the foregoing description has described the keyboard of the present invention in terms of a matrix of rows and columns intersecting one another at right angles, it is recognized by those skilled in the art that various keyboard arrangements having non-parallel rows and columns could be employed without departing from the spirit and scope of this invention. Further, while discrete parts have been described forming the first light transmission member, it is recognized that a single part, preferably conjointly formed with the support plate 23 could be utilized for the first light transmission member. The important advantage of the present invention is the relatively few number of separate parts required to provide an optical keyboard arrangement having N key rollover capability.

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. A keyboard comprising:
   a plurality of keys arranged in an M row by N column matrix format;
   a plurality of at least N light sources for generating N light beams, there being at least one light source for each column;
   a first light transmission member having at least N common light transmission paths each for transmitting at least one of said light beams from one of said N light sources to M terminal points, there being a terminal point for each row;
   a second light transmission member having at least M common light transmission paths, one for each row, each path having N light receptors, each N light receptor of a M light transmission path being aligned with a terminal point of a different light transmission path of said first light transmission member to form a light path therebetween;
   a plurality of interrupters each responsive to the depression of different key and each uniquely located between a terminal point and corresponding light receptor for interrupting the light path therebetween upon key depression;
   a plurality of M light sensors each aligned with a different one of said M light transmission paths for sensing the presence or absence of light transmitted along its associated second light transmission path;
   logic means for timewise sequencing said light sources and for gating the output signals of said sensors to provide a logic indication indicating the depressed key;
   wherein the improvement comprises:
   said first light transmission member having a plurality of M reflecting surfaces along the transmission path of each of said N light beams, each reflecting surface deflecting a portion of its associated light beam vertically from its first plane of travel within said first transmission member to a second plane of travel within said first transmission member;
   said first light transmission member having a second plurality of M reflecting surfaces for deflecting said portions of said light beams along a third plane of travel within said first transmission member vertically displaced from said first plane of travel and in a direction approximately orthogonal to the direction of travel of said light beam in said first plane of travel;
   said second light transmission member having a plurality of at least N reflecting surfaces for each of said M light transmission paths for directing light from said light receptors to said light sensors along each M common light transmission path.

2. The keyboard of claim 1 wherein the size of each of said plurality of M reflecting surfaces is inversely proportional to its distance from its associated N light source.

3. The keyboard of claim 1 further including a support plate for supporting and guiding said plurality of keys, said support plate being integrally formed with said first light transmission member.

4. The keyboard of claim 1 or claim 3 wherein said first light transmission member includes N separate light transmission members, each separate light transmission member having M reflecting surfaces for deflecting said associated light beams vertically.

5. The keyboard of claim 1 wherein each of said second light transmission members has means associated therewith for each of said N light receptors for deflecting received light vertically to said M common transmission paths.

* * * * *